Figure 1:
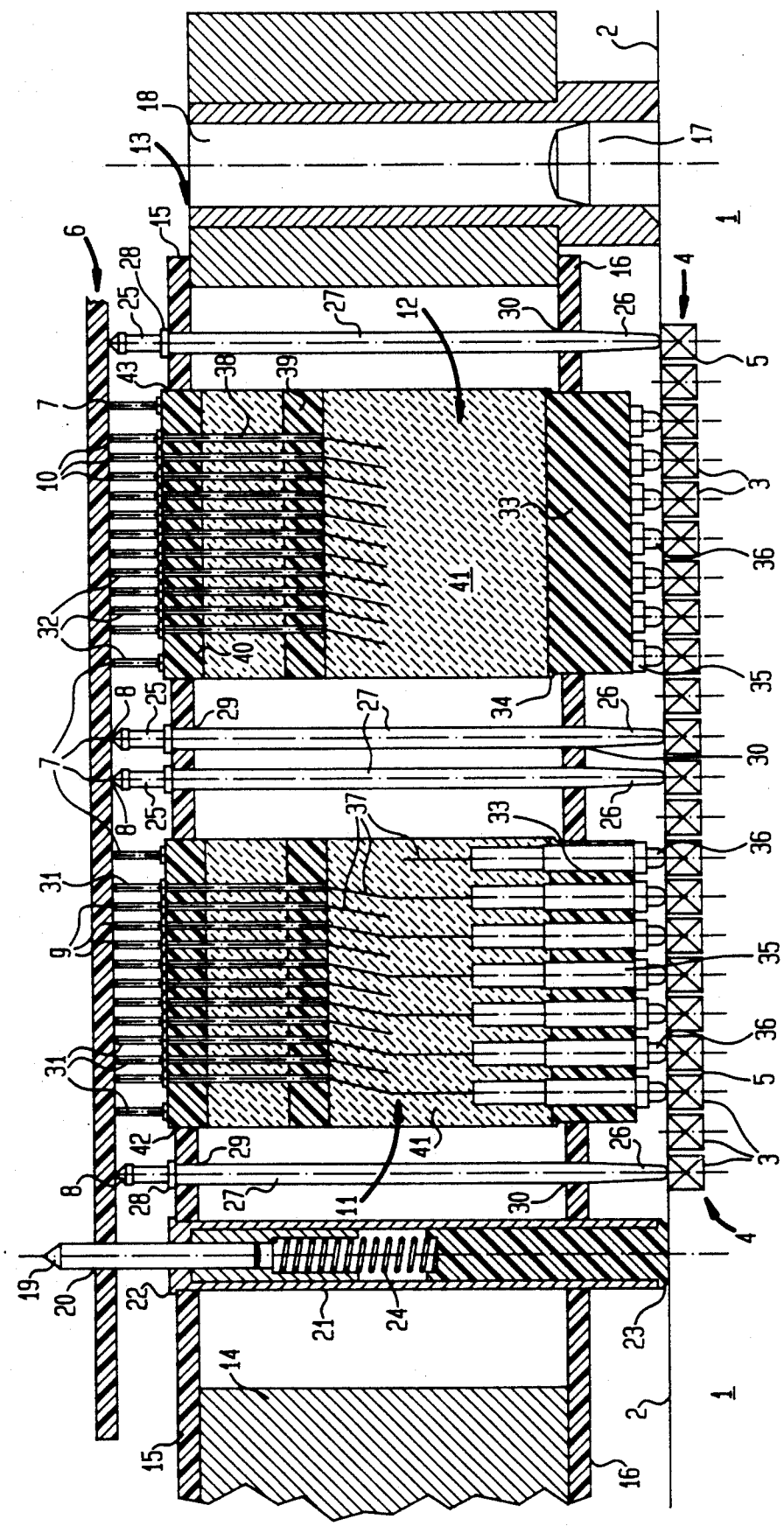

United States Patent

Lang-Dahlke

[11] Patent Number: 5,134,363
[45] Date of Patent: Jul. 28, 1992

[54] ARRANGEMENT FOR TESTING ELECTRICAL PRINTED-CIRCUIT BOARDS

[76] Inventor: Helmut Lang-Dahlke, Brombergstrasse 7, D-7800 Freiburg, Fed. Rep. of Germany

[21] Appl. No.: 236,354

[22] Filed: Jul. 8, 1988

[30] Foreign Application Priority Data

Nov. 11, 1986 [DE] Fed. Rep. of Germany ....... 3638372

[51] Int. Cl.⁵ .......................... G01R 1/02; G01R 1/04
[52] U.S. Cl. ................. 324/158 P; 324/72.5; 324/158 F
[58] Field of Search ............. 324/158 P, 158 F, 72.5

[56] References Cited

U.S. PATENT DOCUMENTS

| | | | |
|---|---|---|---|
| 3,806,801 | 4/1974 | Boe | 324/158 F |
| 4,290,015 | 9/1981 | Labriola | |
| 4,417,204 | 11/1983 | Dehmel et al. | 324/158 F |
| 4,614,386 | 9/1986 | Driller et al. | 324/158 F |
| 4,686,467 | 8/1987 | DeLapp et al. | 324/158 P |
| 4,724,377 | 9/1988 | Maelzer et al. | 324/158 P |
| 4,774,459 | 9/1988 | Maelzer et al. | 324/158 F |

FOREIGN PATENT DOCUMENTS

| | | |
|---|---|---|
| 0135384 | 3/1985 | European Pat. Off. . |
| 3211410 | 9/1983 | Fed. Rep. of Germany . |
| 3312436 | 5/1984 | Fed. Rep. of Germany . |
| 0126475 | 6/1986 | Japan .............. 324/158 F |

*Primary Examiner*—Kenneth A. Wieder
*Assistant Examiner*—William J. Burns
*Attorney, Agent, or Firm*—Kenyon & Kenyon

[57] ABSTRACT

In an arrangement for testing electrical circuit boards an intermediary adapter is disposed between the circuit board and a basic adapter. For converting a grid offset as well as a grid with smaller grid step width to the grid of contact areas in the basic adapter converters (11) are provided which on their top side have test piece-specific arrangements of contact needles (31), for example for SMD structural elements. On the underside the converters (11) are provided with contact pins (36) in a grid corresponding to the contact area bank of the basic adapter. The grid of the contact pins (36) is displaced laterally or diagonally relative to the side edges (44) of converters (11) so that by rotating the converters (11) about their longitudinal axes offsetting the contact pins (36) for contacting the contact areas of the basic adapter can be carried out.

6 Claims, 4 Drawing Sheets

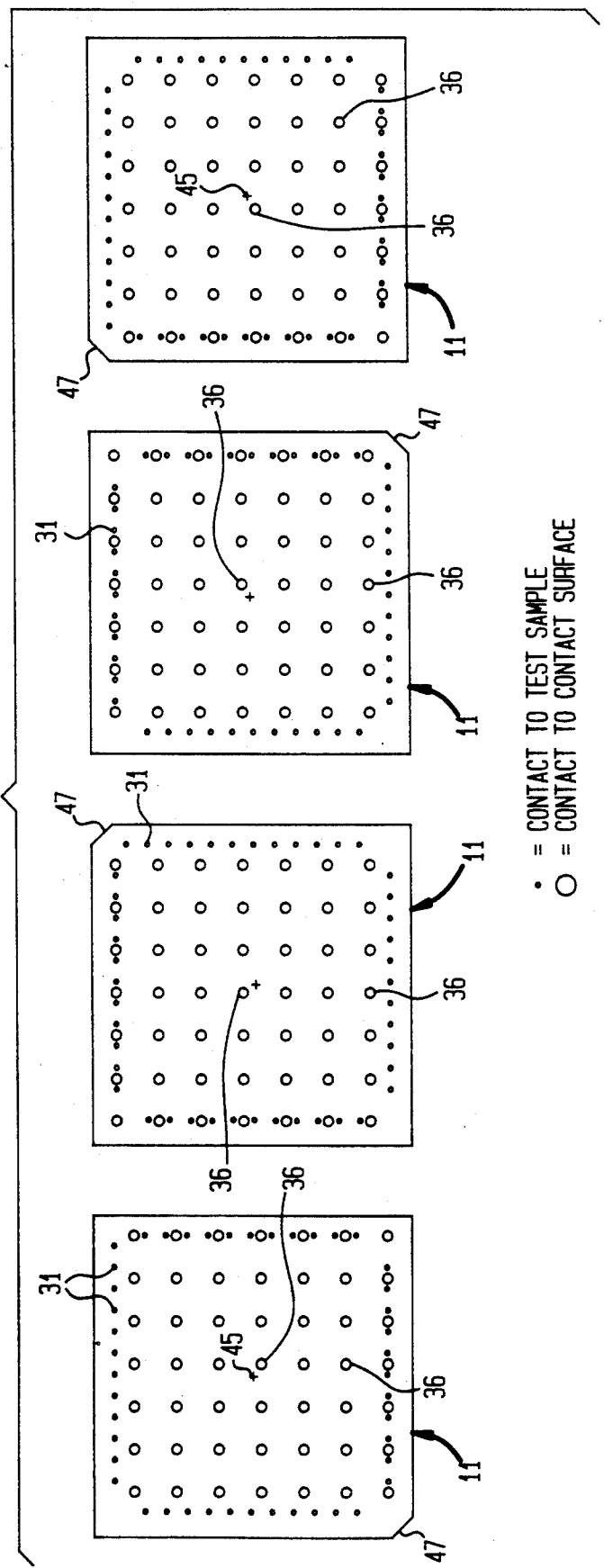

ARRANGEMENT FOR TESTING ELECTRICAL PRINTED-CIRCUIT BOARDS

The invention relates to an arrangement for testing electrical printed-circuit boards with a plurality of needles which can be resiliently pressed against the testing points on the circuit board to be tested and which are connected with an evaluating circuit.

Such arrangements function as contacts of unassembled circuit boards for electronic components to test the conductor tracks on the circuit board. In known arrangement the testing points covered with needles are arranged in accordance with a grid having a grid step width of 1/10 inch. For the SMD structural elements in use for some time circuit boards are required, in which the land area images or solder images for the solder connections of the SMD structural elements are arranged in a smaller grid, for example in a grid of step width 1/20 inch. If a full grid adapter for contacting is constructed in 1/20 inch grid step width, then relative to an adpater with a grid of 1/10 inch a fourfold number of connecting points result whereby technical problems arise as well as increasing costs.

Departing from this prior art the invention is based on the task of creating an arrangement for testing electrical circuit boards in which the disadvantages of a full grid adapter with the smallest occurring step width are avoided.

This task is solved according to the invention in that the needles are arranged on the side of an intermediary adapter facing the circuit board to be tested in a pattern specific to the test piece to which on the side facing away from the circuit board a full grid contact bank of a basic adapter is assigned, which is connectable to the needles through spring pins and wiring.

Useful models and further developments of the invention are characterized in the dependent claims.

Figure 2:
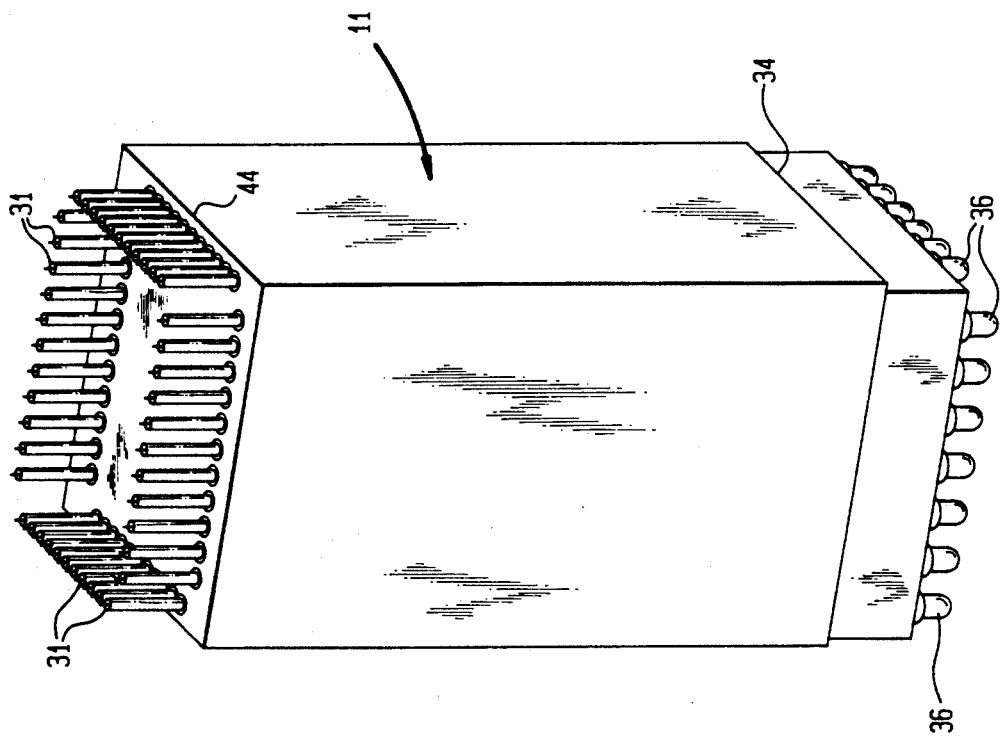
Figure 3:
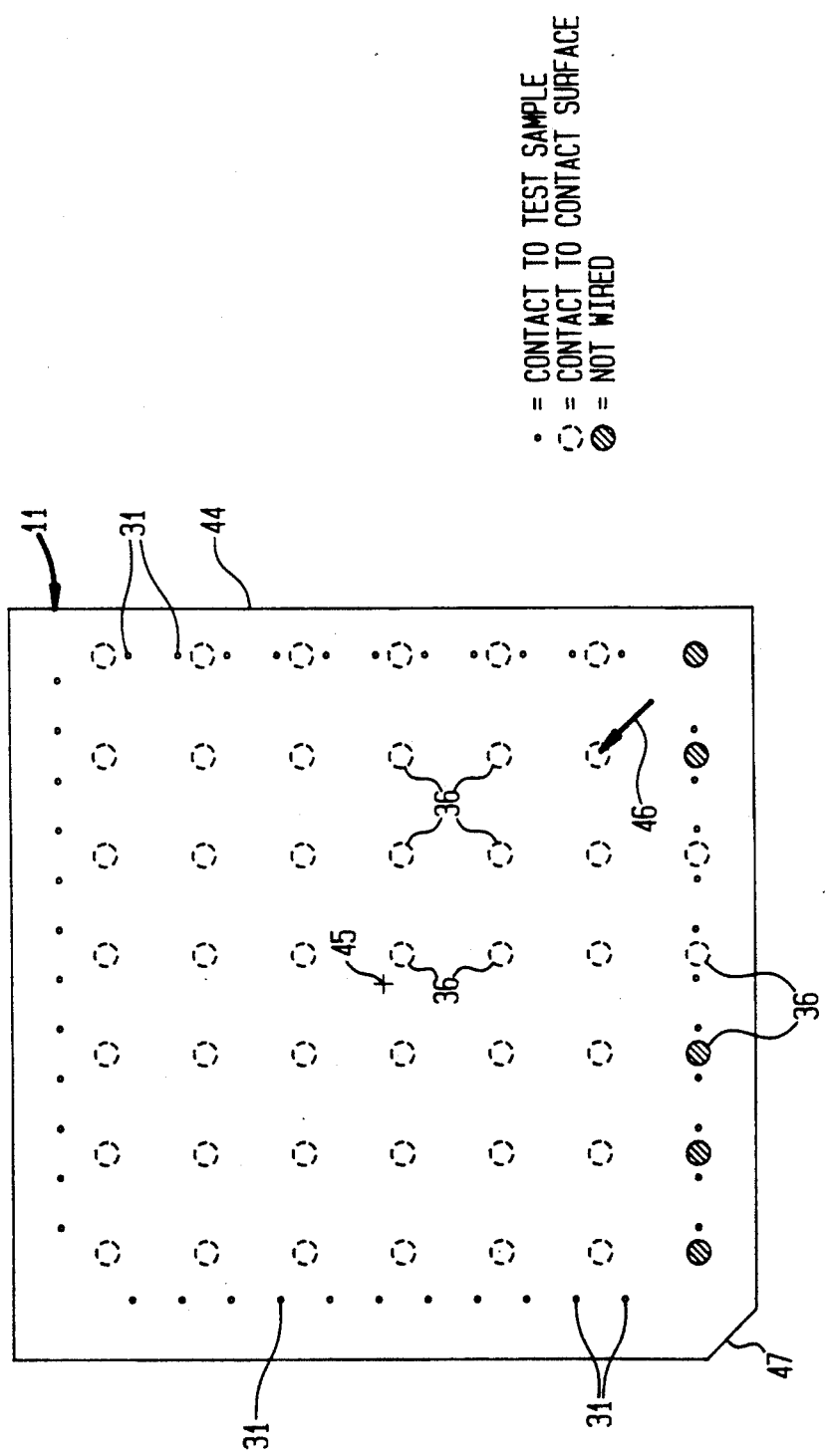

Below, an embodiment of the invention is explained in greater detail with reference to the drawing, in which:

FIG. 1 shows an intermediary adapter of an arrangement for testing electrical circuit boards along with the circuit board to be tested and the contact surface bank of a basic adapter of the arrangement, FIG. 2 a test piece-specific converter to be set into the intermediary adapter according to FIG. 1, FIG. 3 a top view of the topside facing the circuit board of the converter according to FIG. 2 to illustrate the position of the contact needles and contact pins of the converter, and FIG. 4 four rotational positions of the converter for illustrating the displacement of the contact pins at a rotation of the converter by 90°, 180°, and 270°.

In FIG. 1 the structure of the arrangement for testing electrical circuit boards can be seen schematically in section along a plane extending at a right angle to the plane of the circuit board. The arrangement has a basic adapter 1, which is provided with a plurality of contact areas 3 of a contact area bank 4 along its surface 2. The contact areas 3 are arranged in a grid with a grid step width of 1/10 inch. Between the contact areas are non-conducting interspaces 5. The contact areas 3 are connected via lines (not shown in the drawing) to an evaluating circuit which permits testing a circuit board 6 shown at the top in FIG. 1 with solder areas 7 and conductor tracks not shown in the drawing by contacting at a large number of test points. The circuit board 6 in FIG. 1 is an unassembled circuit board which is supplied as test piece to the arrangement for testing electrical circuit boards. On the circuit board 6 first test points 8 with a grid step width of 1/10 inch as well as second test points 9 and third test points 10 are provided which are assigned to the land areas of SMD components and have a grid step width of 1/20 inch.

In the circuit board 6 shown in FIG. 1 every second test point 9 lies on the same grid as the first test points 8. The third test points 10 are displaced relative to the grid lay-out defined by the first test points 8 and through the second test points 9 wherefore a position compensation—discussed further on—is accomplished with converters 11 and 12.

Converters 11 and 12 are detachably set into an intermediary adapter 13 which, as can be seen in FIG. 1, is disposed between the circuit board 6 and the basic adapter 1. The intermediary adapter 13 is equipped with a receiving frame 14 by which an upper contact carrier plate 15 and a lower contact carrier plate 16 are fixed at a distance from each other.

The intermediary adapter 13 is secured relative to the basic adapter 1 with positioning pins 17 which project from the surface 2 of the basic adapter 1 against displacement in the direction of the surface plane 2. To this end recesses 18, of which one is shown in FIG. 1, are provided in the intermediary adapter 13 for the positioning pins 17.

Securing the circuit board 6 relative to the intermediary adapter 13 takes place with catch pins 19 of which one can be seen in FIG. 1. The catch pin 19 projects through a catch bore 20 in the circuit board 6. The position of the catch pins 19 and the catch bores 20 is specific to the test piece. Catch pin 19 is held in a catch pin socket 21 which is provided at its upper end with a stop ring 22 and at its lower end with a foot 23. Inside the catch pin socket 21 there is a spiral spring 24.

In the upper contact carrier plate 15 and the lower contact carrier plate 16 are located openings 29, 30, 42, 43 in each instance aligned in pairs for probe needles 25 and probe pins 26 as well as converters 11 and 12 designed and arranged test piece-specific.

Probe needles 25 are spring-guided in probe needle sockets 27 with a stop collar 28. The lower ends of the probe needle sockets 27 in each instance continue as probe pins 26. The probe needle sockets 27 with probe needles 25 can readily be exchanged so that in the intermediary adapter 13 only those sites are covered with probe needles 25 at which contacting the test piece 6 is to take place. The bores 29 and 30 assigned to probe needles 25 and probe pins 26 are on a grid whose grid step width is 1/10 inch as is the grid step width of contact areas 3 of the basic adapter 1.

At those sites at which on the test piece 6 solder areas 7, second test points 9 or third test points 10 outside the coarse 1/10 inch grid, for example for land areas of SMD components are to be contacted, converters 11 and 12 with contact needles 31 respectively 32 are provided. The arrangement of the contact needles 31 and 32 can be seen in FIG. 2 in perspective and in FIGS. 3 and 4 in top view. The shown configuration represents a special case for a SMD component. The contact needles 31 and 32 of converters 11 and 12 can be adapted to the configuration of the land areas of any given SMD component. The converters 11 and 12 permit a conversion of the grid position of the solder areas for the land areas of the SMD components which in each instance are test piece-specific for a circuit board 6 to the fixedly predetermined grid of the basic adapter 1, even though the grid step width in the basic adapter 1 and the land areas of the SMD components are different, and the solder areas of the SMD components on the circuit board 6 do not fall into the 1/10 inch grid of probe needles 25 or into a grid fixedly displaced relative to this grid.

Converters 11 and 12 have each one base plate 33 with a stop edge 34. In the base plate 33 contact pin sockets 35 for guiding contact pins 36 are fastened corresponding to the grid of the contact areas 3. Contact pins 36 are spring-mounted in contact pin sockets 35 and electrically connected through wiring 37 with contact needle sockets 38 in which the contact needles 31 and 32 are spring-guided. Contact needle sockets 38 extend between an intermediary plate 39 and an end plate 40. The interspaces beween the end plate 40 and the intermediary plate 39 and the intermediary plate 39 and the base plate 33 are compound-filled with a filler 41, for example a polyester resin.

To hold converters 11 and 12 in the upper contact carrier plate 15 as well as the lower contact carrier plate 16 square windows 42 and 43 are provided at sites which are in each instance specific to the test piece. The lateral distance between the windows 42 does not necessarily amount to a multiple of the grid step width of contact pins 36 or contact areas 3. It is for this reason that the converters 11 and 12 are designed unsymmetrically with respect to their mid-longitudinal axes which is seen best in FIG. 3. Converter 12 shown in FIG. 1 is-compared to converter 11 shown in FIG. 1 rotated by 180° about its longitudinal axis extending at a right angle to surf-ace 2

In FIG. 2 a converter 11 with contact needles 31 can be seen in perspective view which, corresponding to the pattern of a SMD structural element, project from the upper side of converter 11. On the under side of converter 11 contact pins 36 can be seen which are arranged in accordance with the customary 1/10 inch grid.

In FIG. 3 in top view the position of contact needles 31 and contact pins 36 is shown. To the 44 shown contact needles 31 a corresponding number of wired contact pins 36 are assigned. Non-wired contact pins 36 are shown hatched in FIG. 3.

As can be seen in FIG. 3 contact needles 31 have everywhere the same distance from the side edges 44. With respect to a center point 45 drawn in FIG. 3, a point symmetry obtains for the side edges 44 as well as also for contact needles 31.

As can be seen further in FIG. 3, the grid of contact pins 36 is not point-symmetric relative to the center 45 but relative to a point-symmetrical arrangement in direction of arrow 46 by 1/40 inch or ¼ of the grid step width of contact pins 36 horizontally and vertically displaced. This displacement permits—inspite of grids in circuit board 6 and basic adapter 1 which do not fit onto each other—carrying out contacting the test point on circuit board 6.

To illustrate the effects of grid displacement of contact pins 36 in FIG. 3 and FIG. 4 a corner 47 is slanted to mark it.

If one starts in FIG. 3 and FIG. 4 from the starting position of converter 11 shown in the far left, removal of converter 11 from windows 42 and 43 and replacement of converter 11 offset by 90° about the center 45 brings about that contact pins 36 relative to the original position are in FIG. 4 displaced downward by one half grid step or 1/20 inch.

Rotating converter 11 further with a total rotation of 180° yields the third position of contact pins 36 shown in FIG. 4, which, relative to the original positioning, are displaced in FIG. 4 by one half grid step downward and to the right. Repeated rotation by 90° leads to the position shown in FIG. 4 at the far right in which the contact pins 36 relative to the original grid shown in FIG. 4 far left are displaced toward the right by one half grid step.

The displacements illustrated in FIG. 4 of contact pins 36 through rotation of converter 11 and 12 while maintaining the grid points assigned to contact needles 31 or 32 permits carrying out compensation displacement of contact points between the contact areas 3 and the rounded-off ends of contact pins 36 so that contact pins 36 can—even given unfavorable position of the SMD solder areas or windows 42 and 43—always be brought into contact with contact areas 3 without ending up between the contact areas 3 due to the particular test piece-specific configuration.

Instead of the embodiment shown in FIG. 1 in which the contact areas 3 are provided on the basic adapter 1 and the contact pins 36 in converters 11 and 12, it is also possible to provide contact areas on the underside of converter 11 and 12, to which in the basic adapter 1 contact pins corresponding to contact pins 36 are assigned. In such case, preferentially, instead of probe pins 26 contact areas are also assigned to probe needles 25.

I claim:

1. An intermediate adapter for use in testing electrical circuit boards, comprising:
   (A) a housing having first and second opening types, means for positioning the housing with respect to an adjacently disposed testing apparatus and means for positioning the housing with respect to an adjacently disposed electrical circuit board;
   (B) first pins for disposition through the first opening types, with the first pins electrically connecting predetermined contact points of the testing apparatus ad the electrical circuit board that have a same pitch;
   (C) at least one converter for disposition i a second opening type, with the converter for electrically connecting predetermined contact points of the testing apparatus and the electrical circuit board of different pitch, the converter further comprising,
   (1) a body having a longitudinal axis,
   (2) a grid of second pins extending from a first end of the body and having a pattern corresponding to at least a portion of the contact points of the electrical circuit board, with the grid of second pins being disposed symmetrically about the longitudinal axis, and
   (3) a grid of third pins extending from a second end of the body and having a pattern corresponding to at least a portion of the contact points of the testing apparatus, with each pin of the grid of second pins being connected to at least one of the pins of the grid of third pins, the grid of third pins being disposed non-symmetrically about the longitudinal axis for compensating for displacement of the contact points of the electrical circuit board and the contact points of the testing apparatus.

2. The adapter as recited in claim 1, wherein the second opening type includes a window with a square cross-section.

3. The adapter as recited in claim 2, wherein the converter has a square cross-section of a size that permits the ingress into, and egress out of, the window.

4. The adapter as recited in claim 1, wherein the grid of third pins is displaced a predetermined amount of a grid step of the grid of third pins.

5. The adapter as recited in claim 4, wherein the grid of third pins is displaced ¼ of a grid step of the grid of third pins.

6. The adapter as recited in claim 5, wherein a grid step of the grid of second pins is ½ the grip step of the grid of third.

* * * * *

UNITED STATES PATENT AND TRADEMARK OFFICE
CERTIFICATE OF CORRECTION

PATENT NO. : 5,134,363
DATED : July 28, 1992
INVENTOR(S) : Helmut LANG-DAHLKE

It is certified that error appears in the above-indentified patent and that said Letters Patent is hereby corrected as shown below:

Column 2, line 58, change "31 respectively 32" to --31, 32 respectively--.

Column 3, line 23, after "16" insert a comma.

Column 3, line 33, change "surf-ace" to --surface--.

Column 3, line 43, delete "44".

Column 4, line 45, change "i" to --in--.

Column 6, line 8, change "third." to --third pins.--.

Column 3, line 31, change "is-compared" to --is compared-- .

Abstract, line 4, after "adapter" insert 1.

Signed and Sealed this

Twenty-third Day of November, 1993

Attest:

BRUCE LEHMAN

Attesting Officer

Commissioner of Patents and Trademarks